United States Patent
Kuo et al.

(10) Patent No.: US 11,791,534 B2
(45) Date of Patent: *Oct. 17, 2023

(54) ANTENNA PACKAGE FOR SIGNAL TRANSMISSION

(71) Applicant: Taiwan Semiconductor Manufacturing Co., Ltd., Hsinchu (TW)

(72) Inventors: Feng-Wei Kuo, Zhudong Township (TW); Wen-Shiang Liao, Toufen Township (TW)

(73) Assignee: Tawian Semiconductor Manufacturing Co., Ltd., Hsinchu (TW)

( * ) Notice: Subject to any disclaimer, the term of this patent is extended or adjusted under 35 U.S.C. 154(b) by 136 days.

This patent is subject to a terminal disclaimer.

(21) Appl. No.: 17/392,680

(22) Filed: Aug. 3, 2021

(65) Prior Publication Data

US 2021/0367324 A1    Nov. 25, 2021

Related U.S. Application Data

(63) Continuation of application No. 16/701,938, filed on Dec. 3, 2019, now Pat. No. 11,114,745.
(Continued)

(51) Int. Cl.
*H01Q 1/22* (2006.01)
*H01L 21/56* (2006.01)
(Continued)

(52) U.S. Cl.
CPC ....... *H01Q 1/2283* (2013.01); *H01L 21/0273* (2013.01); *H01L 21/486* (2013.01);
(Continued)

(58) Field of Classification Search
CPC .............. H01Q 1/2283; H01L 21/4853; H01L 23/49827; H01L 21/0273; H01L 21/568;
(Continued)

(56) References Cited

U.S. PATENT DOCUMENTS 6,770,955 B1  8/2004 Coccioli et al.
8,759,950 B2  6/2014 Kamgaing et al.
(Continued)

FOREIGN PATENT DOCUMENTS

DE    102018125372 A1    6/2019
KR    20140014260 A      2/2014
(Continued)

OTHER PUBLICATIONS

Wi et al., "Package-level integrated antennas based on LTCC technology," IEEE Transactions on Antennas and Propagation, Aug. 2006. vol. 54, No. 8, pp. 2190-2197.

*Primary Examiner* — Karen Kusumakar
(74) *Attorney, Agent, or Firm* — Sterne, Kessler, Goldstein & Fox P.L.L.C.

(57) ABSTRACT

This application relates to a device for signal transmission (e.g., radio frequency transmission) and a method for forming the device. For example, the method includes: depositing an insulating layer that includes polybenzobisoxazole (PBO) on a carrier; forming a backside layer including polyimide (PI) over the adhesive layer; forming a die-attach film (DAF) over the backside layer; forming one or more through-insulator via (TIV)-wall structures and one or more TIV-grating structures on the second backside layer; placing a die, such as a radio frequency (RF) integrated circuit (IC) die, on the DAF; encapsulating the die, the one or more TIV-wall structures, and the one or more TIV-grating structures, with a molding compound to form an antenna package including one or more antenna regions; and forming a redistribution layer (RDL) structure on the encapsulated
(Continued)

package. The RDL structure can include one or more antenna structures coupled to the die. Each of the one or more antenna structures can be positioned over the one or more antenna regions.

20 Claims, 17 Drawing Sheets

Related U.S. Application Data

(60) Provisional application No. 62/908,320, filed on Sep. 30, 2019.

(51) Int. Cl.
    *H01L 21/48*     (2006.01)
    *H01L 21/683*     (2006.01)
    *H01L 21/027*     (2006.01)
    *H01L 23/498*     (2006.01)
    *H01L 23/66*     (2006.01)
    *H01L 23/31*     (2006.01)
    *H01L 23/29*     (2006.01)
    *H01L 23/00*     (2006.01)
    *H01L 23/538*     (2006.01)

(52) U.S. Cl.
    CPC ...... *H01L 21/4853* (2013.01); *H01L 21/4857* (2013.01); *H01L 21/565* (2013.01); *H01L 21/568* (2013.01); *H01L 21/6835* (2013.01); *H01L 23/293* (2013.01); *H01L 23/3128* (2013.01); *H01L 23/3135* (2013.01); *H01L 23/49827* (2013.01); *H01L 23/49838* (2013.01); *H01L 23/5384* (2013.01); *H01L 23/5386* (2013.01); *H01L 23/66* (2013.01); *H01L 24/19* (2013.01); *H01L 24/20* (2013.01); *H01L 2221/68345* (2013.01); *H01L 2221/68359* (2013.01); *H01L 2223/6616* (2013.01); *H01L 2223/6677* (2013.01)

(58) Field of Classification Search
    CPC ........... H01L 21/4857; H01L 23/49838; H01L 21/6835; H01L 23/293; H01L 24/19; H01L 23/5384; H01L 21/486; H01L 23/3135; H01L 23/5386; H01L 23/3128; H01L 21/565; H01L 23/66; H01L 24/20; H01L 2223/6677; H01L 2221/68345; H01L 2223/6616; H01L 2221/68359
    See application file for complete search history.

(56) References Cited

U.S. PATENT DOCUMENTS

| | | | |
|---|---|---|---|
| 9,252,077 | B2 | 2/2016 | Molzer et al. |
| 10,211,171 | B2 | 2/2019 | Liu et al. |
| 10,269,732 | B2 | 4/2019 | Yu et al. |
| 10,756,033 | B2 | 8/2020 | Dalmia et al. |
| 2018/0025999 | A1* | 1/2018 | Yu .................. H01L 23/485 257/428 |
| 2020/0328497 | A1 | 10/2020 | Lin et al. |

FOREIGN PATENT DOCUMENTS

| | | |
|---|---|---|
| KR | 20160089883 A | 7/2016 |
| KR | 20190105546 A | 9/2019 |
| TW | 201929321 A | 7/2016 |
| TW | 201743415 A | 12/2017 |
| TW | 201804591 A | 2/2018 |
| TW | 201901864 A | 1/2019 |
| TW | 201929166 A | 7/2019 |
| WO | WO 2015/157548 A1 | 10/2015 |

* cited by examiner

ANTENNA PACKAGE FOR SIGNAL TRANSMISSION

CROSS-REFERENCE TO RELATED APPLICATIONS

This application is a continuation of U.S. Non-Provisional patent application Ser. No. 16/701,938, filed on Dec. 3, 2019, titled "Antenna Package for Signal Transmission," which claims the benefit of U.S. Provisional Patent Application No. 62/908,320, filed on Sep. 30, 2019, titled "Insulating Substrate with Vertical TIV-Wall & TIV-Gratings to Form Antenna Region for Lateral RF Transmission." The entire contents of the aforementioned applications are incorporated by reference herein in their entireties.

BACKGROUND

Microwaves and millimeter (mm) waves occupy the frequency spectrum from 1 GHz to 30 GHz, and 30 GHz to 300 GHz, respectively. Printed circuit board (PCB) and complementary metal oxide semiconductor (CMOS) substrates can be used to integrate mm-wave antennas with radio frequency (RF) integrated circuits (ICs). CMOS RF chips can include a vertically embedded folded monopole antenna integrated into a low-temperature co-fired ceramic (LTCC) substrate carrier. However, an LTCC implementation may require an excessively large area while the number of components involved, (e.g., inductors, capacitors, and baluns) can cause unwanted electromagnetic and substrate coupling that interferes with performance.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

Figure 1A:
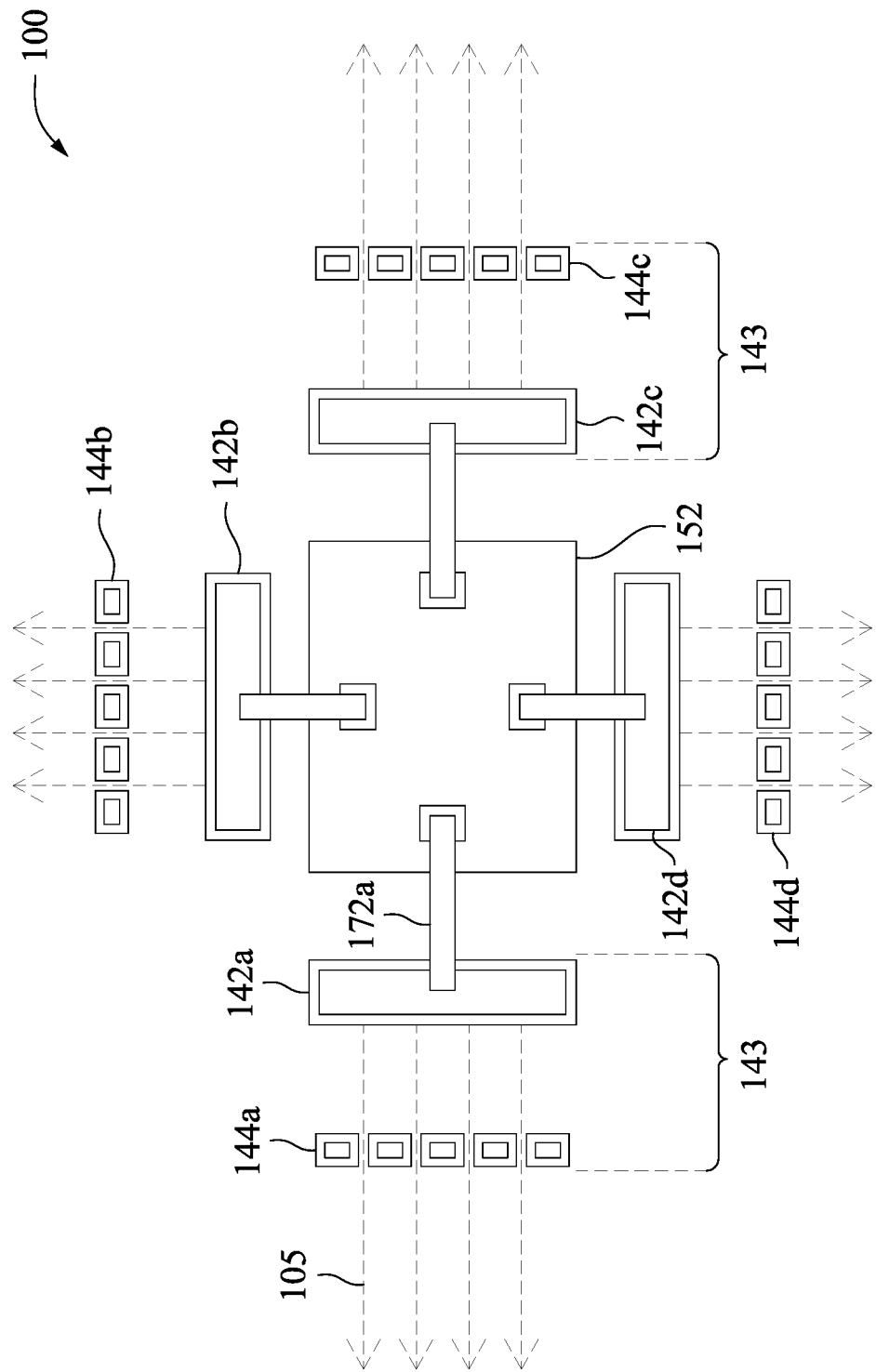
FIGS. 1A to 1B are illustrations of an insulating substrate antenna that incorporate electrical connectors, according to some embodiments.

The accompanying drawings, which are incorporated herein and form part of the specification, illustrate the present disclosure and, together with the description, further serve to explain the principles of the disclosure and to enable a person skilled in the relevant art to make and use the disclosure.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition does not in itself dictate a relationship between the various embodiments and/or configurations discussed.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of a target value (e.g., ±1%, ±2%, ±3%, ±4%, and ±5% of the target value).

Overview

Devices and methods described herein are directed to an insulating substrate antenna that includes one or more emitters and one or more ground planes disposed by through interposer vias (TIVs). The TIVs form one or more antenna regions. Embodiments described herein achieve, among other things, better performance, smaller area, and higher integration than other CMOS RF chips.

Embodiments of the present disclosure relate to a design for an antenna package including an RF die and an insulating substrate having one or more antenna regions. The antenna package includes low-cost, high-efficiency vertical through interposer via walls (TIV-wall) and TIV-gratings to form the antenna regions in the encapsulated package. The vertical TIV antenna regions enable, for example, RF signals to be laterally transmitted and received.

The antenna package (also referred to herein as "package") that includes the antenna regions described above is advantageous and suitable for applications operating at high frequency, such as 5G applications (e.g., greater than 5.8 GHz) and car radar (e.g., approximately 77 to approximately 120 GHz). Such high frequency applications can be directed to, for example, RF transceivers as well as portable, wearable, interne of things (IoT), and smart phone products.

In some embodiments, the antenna package includes a molding compound (MC) layer (also referred to herein as a dielectric layer or an insulating layer) above an RF die, where the MC layer includes polyimide (PI) and has a low dielectric constant (low-k), e.g., about 2.8 or between about 2.8 and about 3.0. The MC layer can reduce the coupling effect caused by RF die components, such as inductors, capacitors, and baluns.

In some embodiments, an insulator substrate can be formed of various materials, such as polyimide (PI), polybenzobisoxazole (PBO), molding compound, polymers, silicon dioxide ($SiO_2$), silicon-on-glass (SOG), glass, ceramics, sapphire ($Al_2O_3$), and other similar materials. In some embodiments, the insulator substrate can be fabricated with a flexible thickness between about 200 μm and 2 mm. Moreover, integrating the antenna package into smaller three dimensional integrated circuit (3DIC) packaging allows the device to be suitable for high frequency 5G and car radar applications (e.g., 5.8 GHz, 28 GHz, and 77 to 120 GHz applications).

Insulating Substrate with Antenna Regions

Figure 1B:
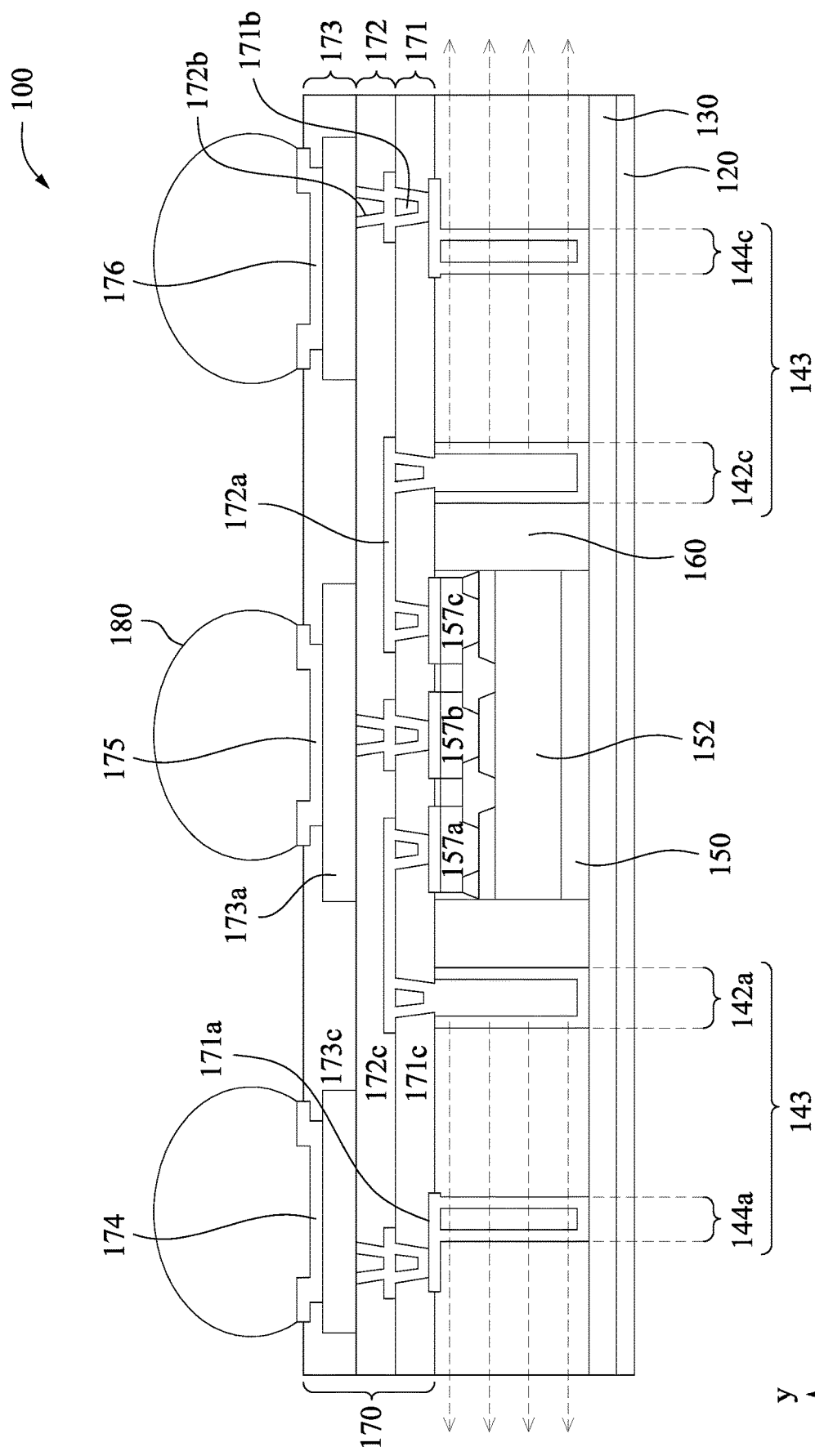

FIGS. 1A to 1B illustrate package 100 (also referred to herein as an "insulating substrate antenna," an "encapsulated package," or an "antenna package"). Package 100 can include one or more IC die (e.g., RF IC die) and one or more antenna regions. Integrated fan-out (InFO) packages can be integrated with package 100 that include one or more antenna regions coupled to the one or more IC die. For example, one or more antenna regions can be integrated with the IC die through an integrated fan-out redistribution structure that includes a metallization layer (e.g., a redistribution layer or "RDL" structure) coupled to a package molding compound with the IC die embedded therein. Some embodiments described below are in the context of InFO packages. Based on the description herein, embodiments of the present disclosure are applicable to other types of packages; these other types of packages are within the spirit and scope of the present disclosure.

FIG. 1A illustrates an exemplary top plan view of package 100. Package 100 includes a die 152, which can be an RF IC die, coupled to a first via-wall 142a, a second via-wall 142b, third via-wall 142c, and fourth via-wall 142d by redistribution layer (RDL) wirings 172a. First to fourth TIV-walls 142a to 142d can be coupled to die 152 to function as RF emitters, according to some embodiments.

Package 100 includes first to fourth TIV-gratings 144a to 144d. As shown here, in some embodiments first to fourth TIV-gratings 144a to 144d can be laterally (e.g., in the x-direction or in the y-direction of FIG. 1A) arranged outside of first to fourth TIV-walls 142a to 142d, respectively. First to fourth TIV-gratings 144a to 144d can be coupled to one or more grounding terminals to function as RF ground planes, according to some embodiments. Each RF ground plane functions as an electrical conductor to reflect and direct radiation emitted from first to fourth TIV-walls 142a to 142d. Thus, RF transmissions 105 can be directed by the RF ground planes provided by first to fourth TIV-gratings 144a to 144d. Though RF transmissions are discussed herein, other types of signal transmissions are within the spirit and scope of the present disclosure.

FIG. 1B illustrates package 100 in a cross sectional view. As shown in FIG. 1B, package 100 includes a first back side layer 120, a second back side layer 130, first via-wall 142a, third via-wall 142c, first via-grating 144a, third via-grating 144c, die attach film 150, RF die 152, first to third RF die connectors 154a to 154c, first to third pads 156a to 156c, first to third pad terminals 157a to 157c, and encapsulating layer 160. TIV-walls 142a and 142c include conductors 143a and 143c, respectively. TIV-gratings 144a and 144c include connectors 145a and 145c, respectively. TIV-walls 142b and 142d and TIV-gratings 144b and 144c (not shown in the cross-sectional view of FIG. 1B) also include conductors.

An interconnect structure 170 (also referred to as an RDL structure or a top-side RDL) is disposed over the encapsulating layer 160. Interconnect structure 170 includes a first insulating layer 171 and connectors 171a to 171g. Interconnect structure 170 further includes a second insulating layer 173 and connectors 173a to 173c formed over first insulating layer 171.

Referring to FIG. 1B, a backside layer 120 is provided. Backside layer 120 is a dielectric layer, which can include a polymer. The backside layer 120 can function as a final protective insulator for package 100. The polymer can be, for example, a polyimide (PI), a polybenzoxazole (PBO), a benzocyclobutene (BCB), an ajinomoto buildup film (ABF), a solder resist film (SR), or other suitable material. Backside layer 120 is a planar layer having a uniform thickness, where the thickness can be greater than about 2 μm (e.g., between about 2 μm and about 40 μm). The top and the bottom surfaces of the backside layer 120 are also planar.

Referring to FIG. 1B, a backside layer 130 is provided over protective layer 120. Backside layer 130 is a dielectric layer, which can include a polymer. Backside layer 130 can function as a final protective insulator for package 100. The polymer can be, for example, a polyimide (PI), a polybenzoxazole (PBO), a benzocyclobutene (BCB), an ajinomoto buildup film (ABF), a solder resist film (SR), or other suitable material. Backside layer 130 is a planar layer having a uniform thickness, where the thickness can be greater than about 2 μm (e.g., between about 2 μm and about 40 μm). The top and the bottom surfaces of backside layer 130 are also planar.

TIV-walls 142a to 142d are disposed over backside layer 130 to form spaced apart first and second TIV openings. TIV-walls 142a to 142d can be electrically coupled to a die, such as an RF die described below, to transmit and/or receive communication by an RF signal. TIV-walls 142a to 142d can be formed by first providing a photoresist layer on the backside layer 130, and etching the photoresist layer to form spaced apart TIV openings. A titanium and copper seed layer structure can be deposited on the photoresist layer, and a copper layer can be electroplated on the titanium and copper seed layer. The photoresist layer can then be removed, leaving TIV-walls 142a to 142d. Although four walls are illustrated in FIG. 1A (two shown in the cross-section in FIG. 1B), the number of TIV-walls is not limited to any specific number. TIV-gratings 144a to 144d can be formed in a similar manner as TIV-walls 142a to 142d. TIV-gratings are connected to one or more ground planes. Thus, antenna regions structures 143 are formed by each spacing provided between TIV-walls 142a to 142d and TIV-gratings 144a and 144d.

Each antenna region 143 can be filled with any one of a number of insulator materials compatible with package processing (e.g., InFO package processing) and not limited by the insulator's dielectric constant. In some embodiments described below, the insulator can have a low dielectric constant (i.e., low-k; e.g., about 2.8, or about 2.8 to about 3.0). In other embodiments, the insulator can have a dielectric constant specified by with fabrication of the InFO package. Thus, the antenna package of the present disclosure can be robustly implemented in a package (e.g., InFO package) process using high-k or low-k materials.

Die 152 (e.g., an RF die such as an RF IC die) is placed on backside layer 130. Die 152 can be adhered to the backside layer 130 using a die-attach film (DAF) 150. In a non-limiting example, die 152 can include a semiconductor substrate (e.g., a silicon substrate) with a back surface in contact with DAF 150. A portion of die 152, such as a top portion, can include conductive pillars (e.g., formed of copper, other metals, or an alloy including one or more metal) that electrically connect die 152 to other conductive devices and interconnect structures.

Package 100 includes fan out wirings between input/output (I/O) pins on the die and package I/O pins that can be formed in an interconnect layer (e.g., redistribution layer (RDL)) over the die. The die is surrounded laterally by a medium, such as a molding compound, encapsulant, epoxy resin, or the like. The interconnect layer can extend laterally beyond the perimeter of the die. The interconnect layer includes a patternable dielectric material, in which conductive patterns and conductive vias can be formed. Packages, such as InFO packages, can provide significantly thinner packages with tighter redistribution line pitches (e.g., 10 µm) compared to other fan-out structures for die packaging technologies. InFO packages can provide advantages over other packages, such as flip-chip ball grid array (FC-BGA) packaging, since passive devices such as inductors and capacitors can be formed beyond the perimeter of an IC die (e.g., over the molding compound) for lower substrate loss and higher electrical performance. The InFO package can result in a compact die form factor, which can lead to improved thermal performance and a lower operating temperature for the same power budget. In some embodiments, with the improved thermal performance, faster circuit operation speed can be achieved for the same temperature profile as the FC-BGA package.

As shown in FIG. 1B, redistribution layer (RDL) structure 170 includes three interconnect (also referred to herein as top-side redistribution line (RDL)) layers 171, 172, and 173. In other embodiments, different number of RDL layers can be included. Each interconnect layer includes RDLs and vias that are metal conductor features that provide electrical interconnections through and within RDL structure 170. In some embodiments, the RDL lines and vias can include copper. In first interconnect layer 171, first level conductors (RDL-1) 171a and first level vias (RDL-1 vias) 171b provide interconnections. In first top-side RDL interconnect layer 171, a dielectric layer 171c is provided over RDL-1 171a. In second top-side RDL layer 172, second level conductors (RDL-2) 172a and second level vias (RDL-2 vias) 172b provide interconnections. In second top-side RDL layer 172, a dielectric layer 172c is provided over RDL-2 172a. In third top-side RDL layer 173, third level conductors (RDL-3) 173a and under ball metal (UBM) pads 174, 175, and 176 provide interconnections. Solder bumps 180 are formed on UBM pads 174-176. In third top-side RDL layer 173, a dielectric layer 173c is provided over RDL-3 173a. A ground plane can be electrically connected to one or more solder bumps 180.

Die 152 can be adhered to backside buffer layer 130 using a die-attach-film (DAF) 152. Die 152 can include a semiconductor substrate (e.g., a silicon substrate) whose back surface is in contact with DAF 150. Die 152 includes metal pillars 157a-c (e.g., copper posts) that are formed as the top portions of die 152 that electrically connect die 152 to other conductive devices and interconnect structures.

Fabrication Process for Insulating Substrate with Antenna Regions

Method 200 will be described with respect to FIGS. 3 to 15. FIGS. 3 to 15 are for illustrative purposes only and are not to scale. In addition, FIGS. 3-15 may not reflect the actual geometry of the real structures, features, or layers. Some structures, layers, or geometries may have been deliberately augmented or omitted for illustrative and clarity purposes.

Figure 2:
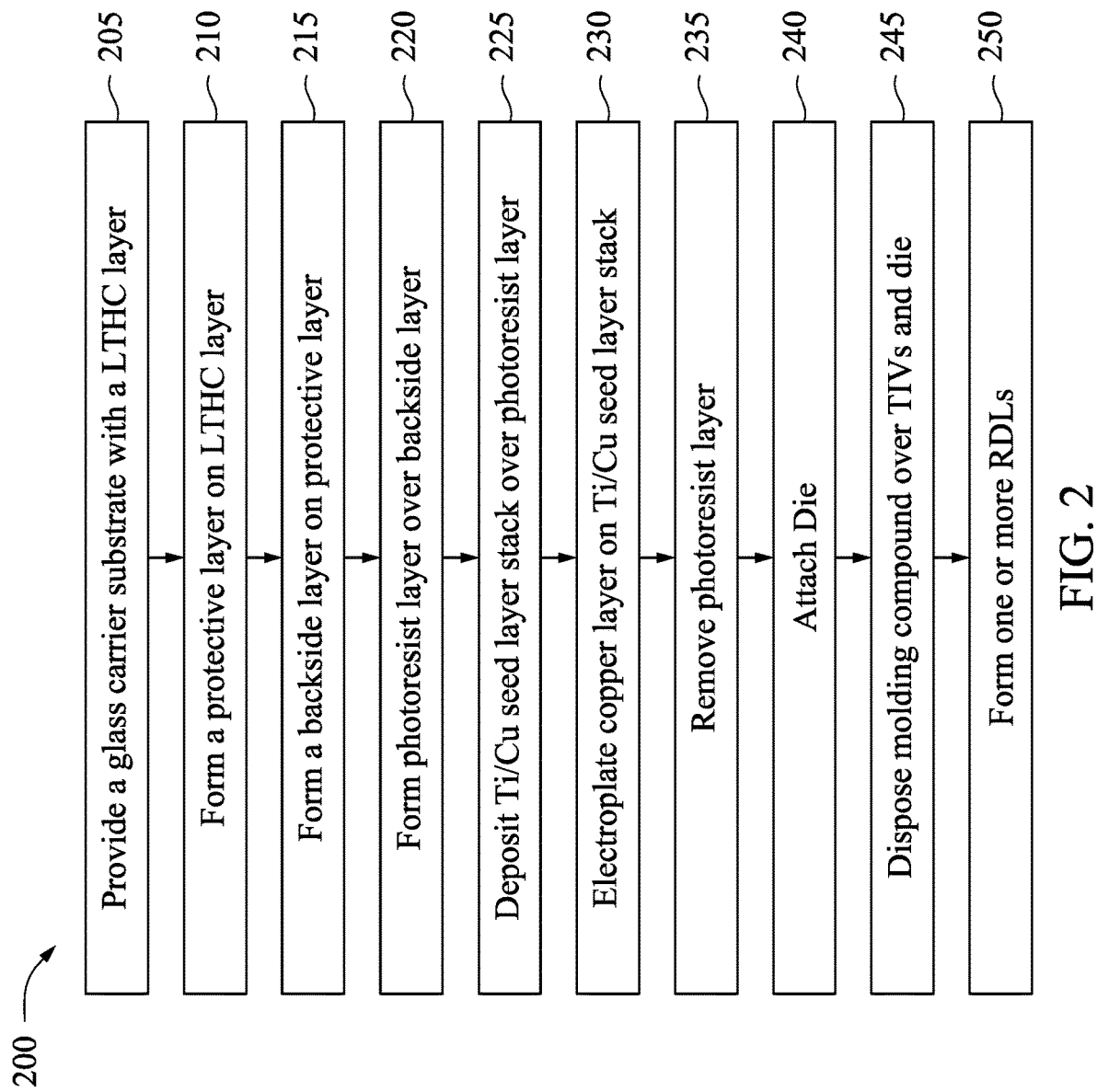
FIG. 2 is a flowchart of a method for forming an insulating substrate antenna, according to some embodiments.
Figure 3:
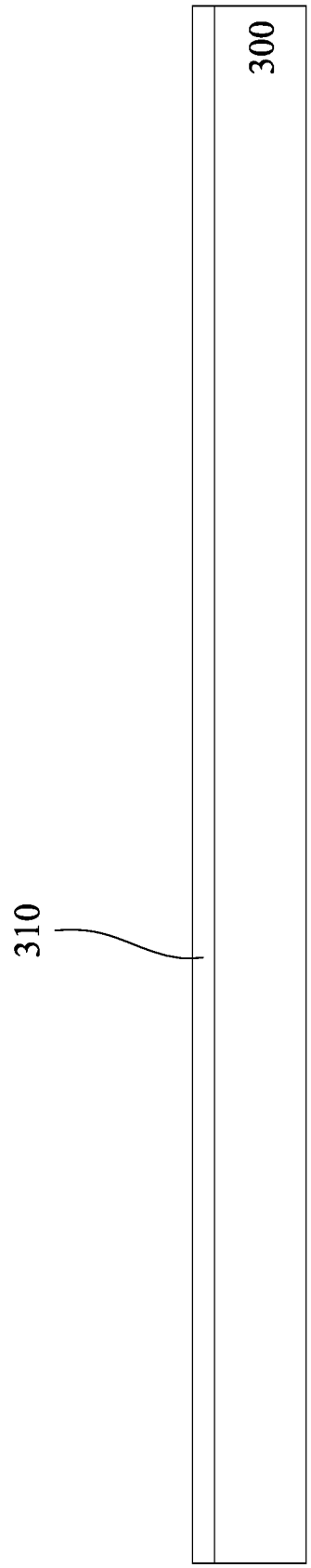
FIGS. 3 to 15 are illustrations of structures associated with a method for forming an insulating substrate antenna, according to some embodiments.

Referring to FIG. 2, exemplary fabrication method 200 begins with operation 205, where a carrier substrate 300, such as a glass carrier substrate, is provided with a light to heat conversion layer (LTHC) 310 disposed thereon, as shown in FIG. 3. In some embodiments, carrier substrate 300 provides mechanical support to structural elements attached or fabricated in subsequent operations of method 200. LTHC 310 is an adhesive layer that can be cured with ultra-violet (UV) light to create a temporary bond between a polymer layer and carrier substrate 300. This temporary bond can be broken to release a polymer layer from carrier substrate 300 once the packaging (e.g., InFO packaging) is completed. By way of example and not limitation, irradiation of LTHC 310 with a focused laser beam through the backside of carrier substrate 300 can generate sufficient heat to decompose LTHC 310 and release carrier substrate 300 from the polymer layer. For a successful release, carrier substrate 300 is required to be transparent to a light source (e.g., a laser) that can irradiate and decompose LTHC 310.

Figure 4:
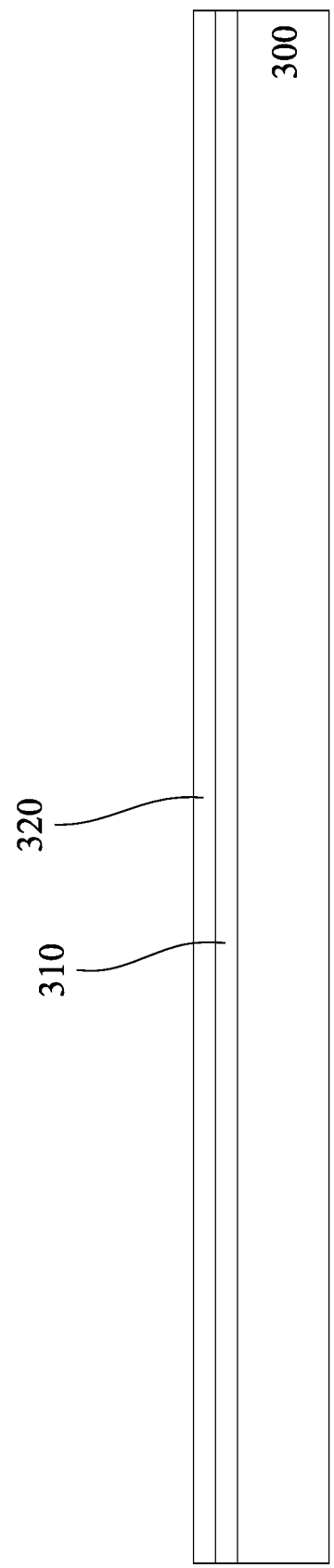

Referring to FIG. 2, method 200 continues with operation 210, where protective layer 320 is formed on LTHC 310, as shown in FIG. 4. By way of example and not limitation, protective layer 320 can include a polyimide (PI), a polybenzoxazole (PBO), or another suitable polymer material. In some embodiments, protective layer 320 (also referred to herein as "polymer layer 320") is a stress relief coating used as a protective layer or a "buffer coat" prior to forming an RF region structure. In some embodiments, protective layer 320 can be deposited and hardened by a spin coating process followed by a curing process.

Figure 5:
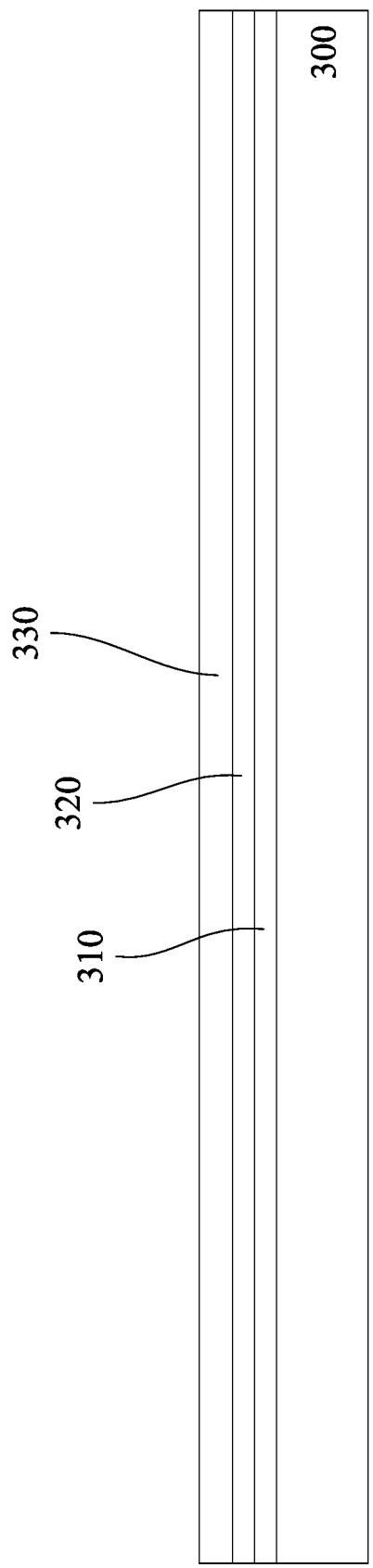

Referring to FIG. 2, method 200 continues with operation 215 and the process of forming a backside layer, as shown in FIG. 5. By way of example and not limitation, backside layer 330 can include a polyimide (PI), a polybenzoxazole (PBO), or another suitable polymer material. In some embodiments, backside layer 330 (also referred to herein as "polymer layer 330") is a radiation suppression layer that allows backside radiation to be recovered into an RF region structure and added constructively to form a laterally-directed beam. In some embodiments, backside layer 330 can be deposited and hardened by a spin coating process followed by a curing process.

Figure 6:
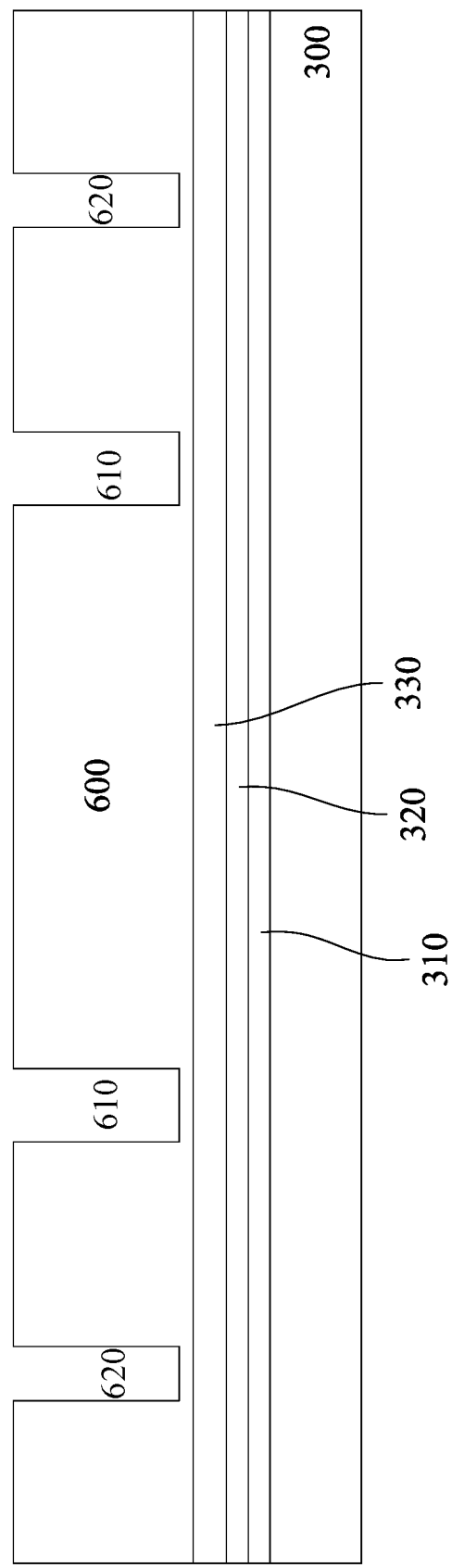

Referring to FIG. 2, method 200 continues with operation 220 and the process of forming through interposer vias (TIVs) over backside layer 330. In some embodiments, one or more of the TIVs can be used to define the surface areas of respective TIV-walls, while one or more TIVs can be used to define the surface areas of respective TIV-gratings. By way of example and not limitation, the TIVs in operation 220 can be formed using photolithography and etching operations. For example, referring to FIG. 6, at operation 220, a photoresist layer 600 with a thickness between about 180 µm and about 250 µm can be spin-coated over backside layer 330. Photoresist layer 600 can be subsequently patterned to form TIV openings 610 and 620, as shown in FIG. 6.

In some embodiments, TIV openings 610 are used to define the surface area of TIV-walls, while TIV openings 620 are used to form TIV-gratings. TIV openings 610 can be designed to have different dimensions from TIV openings 620. For example, TIV openings 610 can have a width 10 um and a length 50,000 um to form a striped plate structure while TIV openings can have a width 10 um and a length 10 um to form a grating plate structure. In some embodiments, TIV openings 610 can have a width 20 um and a length 90,000 um that is different from respective widths and lengths of TIV openings 620, as shown in FIG. 6. In other embodiments, TIV openings 610 can have a same width 100 um and length 100 um as TIV openings 620.

Figure 7:
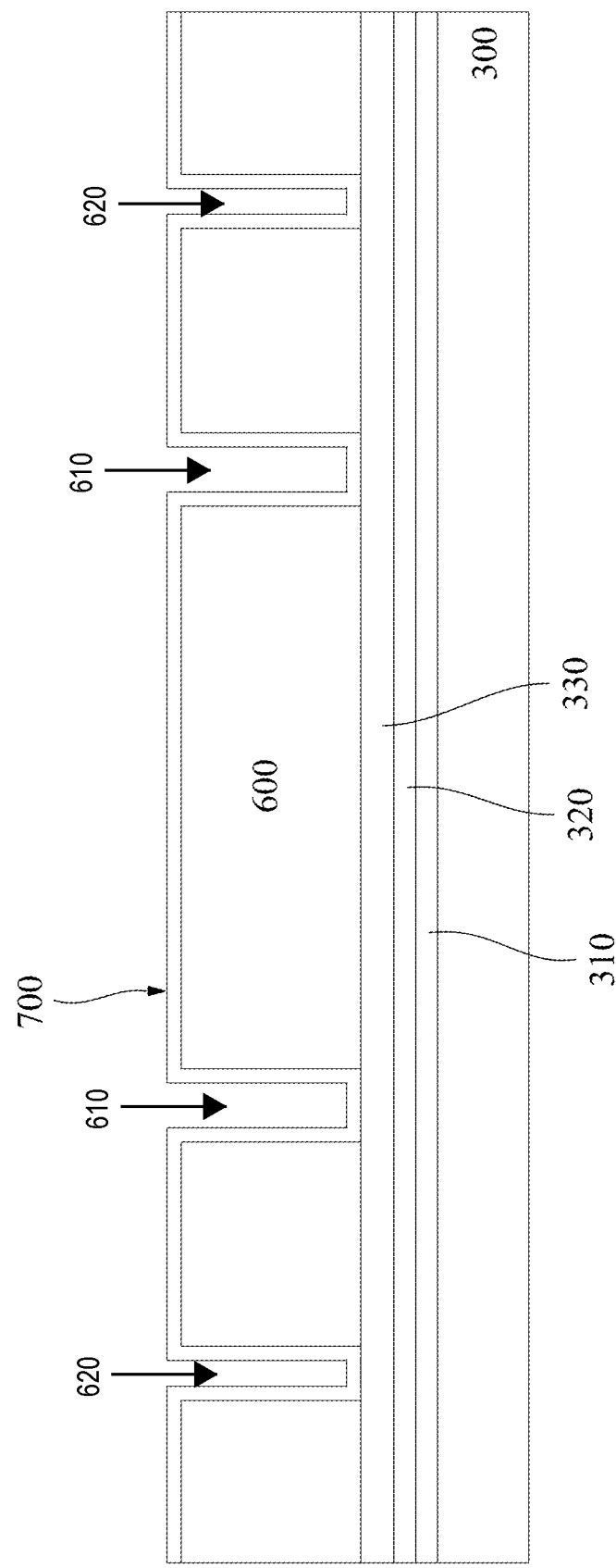

Referring to FIGS. 2 and 7, method 200 continues with operation 225 where a titanium and copper seed layer stack 700 is deposited (e.g., with a PVD process) over patterned photoresist layer 600 to cover the sidewalls and bottom surfaces of openings 610 and 620. In some embodiments, seed layer stack 700 is deposited over photoresist layer 600, as shown in FIG. 7. In some embodiments, the titanium layer can be about 1000 Å and the copper seed layer can be about 5000 Å.

Figure 8:
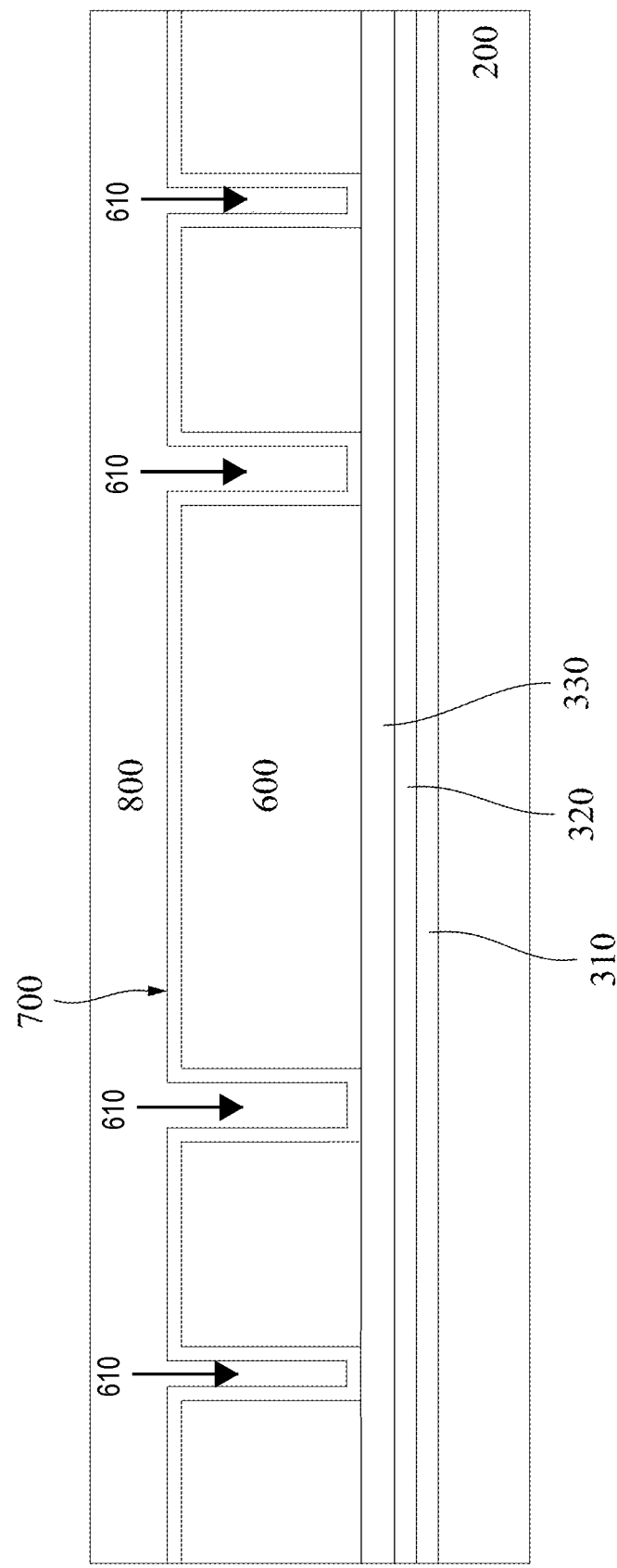

Referring to FIGS. 2 and 8, method 200 continues with operation 230 where a copper layer 800 is electroplated on the titanium and copper seed layer stack 700 to fill openings 610 and 620 and form respective TIV-walls 610*a* and 610*b* and TIV-gratings 620*a* and 620*b*. In some embodiments, the as-deposited copper layer 800 can grow over photoresist layer 600 on seed layer stack 700. Copper layer 800 can be subsequently planarized and polished with a chemical mechanical planarization (CMP) process to remove portions of copper layer 800 over the top surface of photoresist layer 600. In some embodiments, and during the copper CMP process, seed layer stack 700 is also removed from the top surface of photoresist layer 600 as shown in FIG. 8. The thickness of photoresist layer 600, which can range in some embodiments between about 100 µm to about 1000 µm, defines the height of TIV-walls 610*a* and 610*b* and TIV-gratings 620*a* and 620*b* at this stage of the fabrication process.

Figure 9:
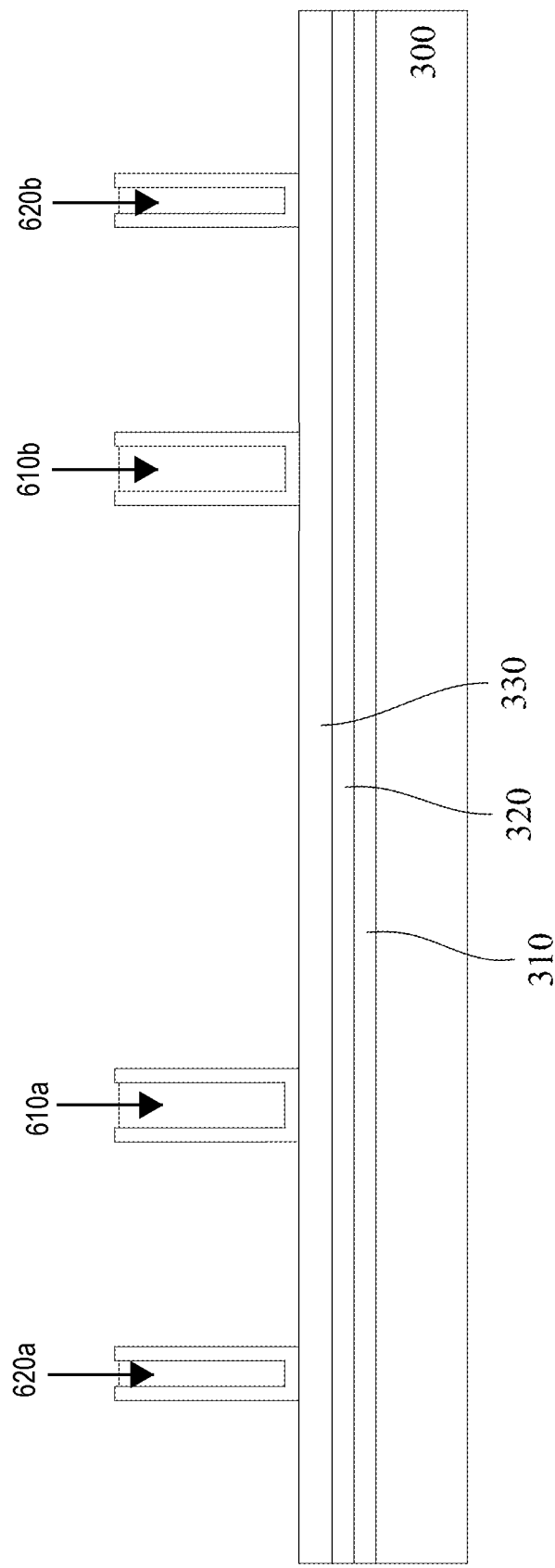

Referring to method 200 in FIG. 2, at operation 235, after forming TIV-walls 610*a* and 610*b* and TIV-gratings 620*a* and 620*b*, photoresist layer 600 can be removed with a wet etching process as shown in FIG. 9. According to some embodiments, TIV-walls 610*a* and 610*b* have different widths compared to TIV-gratings 620*a* and 620*b* as discussed above with reference to openings 610 and 620, shown in FIG. 6. For example, TIV-walls 610*a* and 610*b* can have widths between about 10 µm and 1000 µm while TIV-gratings 620*a* and 620*b* can have a width of about 10 to 100 µm. TIV-walls 610*a* and 610*b* and TIV-gratings 620*a* and 620*b* provide an antenna region structure in the antenna package between the backside layer 330 and the InFO packaging.

Figure 10:
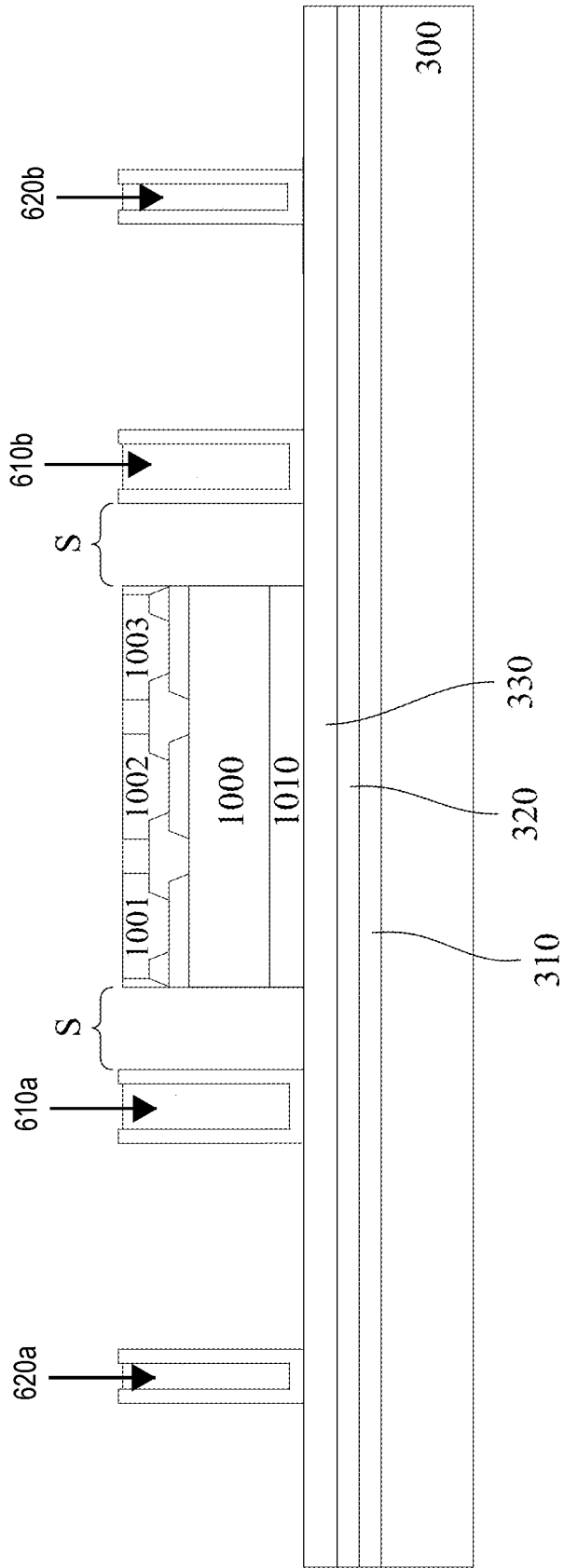

Referring to FIG. 2, method 200 continues with operation 240 and the process of placing (e.g., attaching) a die 1000 on protective layer 320 as shown in FIG. 10. In some embodiments, die 1000 may have, for example, radio frequency communications functionality, such as a radio frequency integrated circuit (RF IC) die. Die 1000 may have other or additional functions. Die 1000 may have been pre-fabricated using chip fabrication processes and may include transistors and multiple interconnect layers configured to implement their functionality (e.g., RF communications). In some embodiments, a portion, such as a top portion, of die 1000 can include conductive pillars (e.g., formed of copper, other metals, or an alloy including one or more metal) that electrically connects die 1000 to other conductive devices and interconnect structures.

In some embodiments, a die-attach-film (DAF) 1010 acts as a glue layer and is interposed between die 1000 and backside layer 330. By way of example and not limitation, DAF 1010 can have a thickness between about 10 µm and about 20 µm. In some embodiments, DAF 1010 is a dielectric material. By way of example and not limitation, the height of die 1000 can be comparable to that of TIV-walls 610*a* and 610*b*, TIV-gratings 620*a* and 620*b*. If die 1000 is taller than TIV-walls 610*a* and 610*b* and TIV-gratings 620*a* and 620*b*, it can be recessed to the height of TIV-walls 610*a* and 610*b* and TIV-gratings 620*a* and 620*b*. According to some embodiments, multiple dies can be attached to polymer layer 330 during operation 240. To avoid forming parasitic capacitances between the TIVs and die 1000, a minimum spacing S between about 20 µm and 30 µm may be appropriate. Spacing S can be adjusted below about 20 µm if a material with sufficiently low dielectric constant (e.g., lower than about 2.8) can be used to isolate the TIVs and die 1000.

Figure 11:
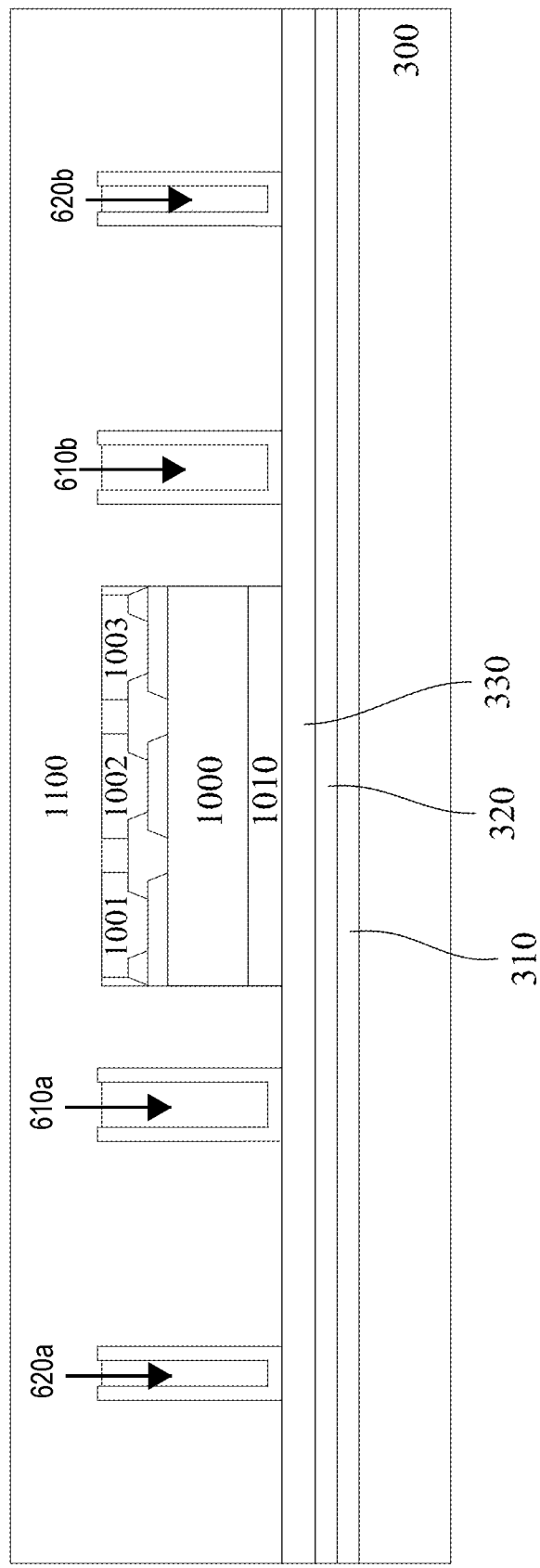

In referring to FIGS. 2 and 11, method 200 continues with operation 245 and the process of disposing a molding compound (MC) 1100 on polymer layer 320 to surround die 1000, TIV-walls 610*a* and 610*b* and TIV-gratings 620*a* and 620*b*. By way of example and not limitation, molding compound 1100 can be spin-coated on polymer layer 320. According to some embodiments, molding compound 1100 is an epoxy-based material that is a solid at room temperature and a liquid when heated at temperatures greater than, for example, 250° C. In some embodiments, molding compound 1100 is melted before being spin-coated on backside layer 330. By way of example and not limitation, the spin-coated molding compound can have a thickness between about 230 µm and about 300 µm. This means that the as-coated molding compound 1100 can have an overburden of about 50 µm—for example, it may extend about 50 µm over the top surfaces of die 1000, TIV-walls 610*a* and 610*b*, and TIV-gratings 620*a* and 620*b*.

According to some embodiments, die 1000 and TIV-walls 610*a* and 610*b* and TIV-gratings 620*a* and 620*b* can be embedded in molding compound 1100 having a low dielectric constant, e.g., approximately 2.8 to form antenna regions. This example is not limiting and antenna regions 630*a* and 630*b* can be provided and filled with any one of a number of insulator materials compatible with package processing (e.g., InFO package processing) not limited by the insulator's dielectric constant. The antenna region structure (e.g., antenna regions 630*a* and 630*b*, which include TIV-walls 610*a* and 610*b*, TIV-gratings 620*a* and 620*b*, and molding compound 1100) provided according to some embodiments of the present disclosure may improve the reflection coefficient (the S11 parameter) of the insulating substrate antenna structure in an InFO package, especially in high frequency applications that employ antenna efficiency at frequencies of 5.8 GHz and higher. The antenna region structure also helps reduce the undesirable couplings of the antenna to the nearby circuits and prevents unwanted noise from the circuits from reaching the antenna. In some embodiments, the arrangement of TIV-gratings 620*a* and 620*b* extends laterally outside TIV-walls 610*a* and 610*b* that achieves improved grounding and return loss.

Figure 12:
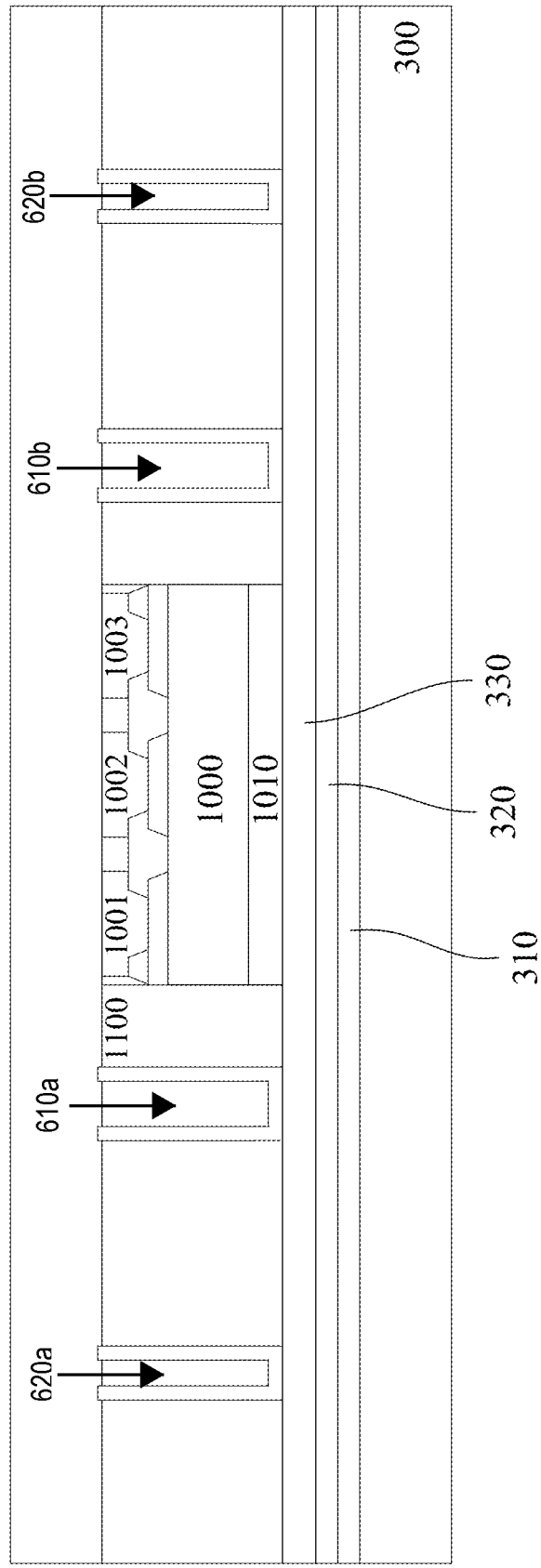

After the application of molding compound 1100 on carrier substrate 300, molding compound 1100 can be left to cool and harden. Once molding compound 1100 hardens, it can be partially grinded so that about 98% of the 50 µm overburden is removed, as shown in FIG. 12. The grinding process leaves the top surface of molding material compound 1100 rough. According to some embodiments, a CMP process can be subsequently used to planarize, polish, and remove the remaining portion of molding compound 1100 (e.g., about 1 µm, which is the remaining about 2% of the 50 µm overburden) until the top surfaces of die 1000, TIV-walls 610*a* and 610*b*, and TIV-gratings 620*a* and 620*b* are exposed. In some embodiments, molding compound 1100 provides structural support and electrical isolation to die 1000, TIV-walls 610*a* and 610*b*, and TIV-gratings 620*a* and 620*b*. Since molding compound 1100 melts at temperatures greater than about 250° C., the thermal budget for any subsequent fabrication operations should be limited to about 250° C. If a molding compound with greater temperature tolerances is used, then the thermal budget of subsequent fabrication operations may increase provided that no other thermal budget limitations exist.

Referring to FIG. 2, method 200 continues with operation 250 and the process of forming one or more RDLs to provide electrical connections to die 1000, TIV-walls 610*a* and 610*b* and TIV-gratings 620*a* and 620*b*. During operation 250, electrical connections to other elements and TIVs can be formed. For example, electrical connections between die 1000 and TIV-walls 610a and 610b can also be completed during operation 250.

By way of example and not limitation, each additional RDL can include a new polymer layer. For example, referring to FIG. 13, a polymer layer 1300—which is similar to polymer layer 320—is disposed on molding compound 1100. In some embodiments, polymer layer 1300 is a low-k dielectric material with a k-value of about 2.8 and a thickness of about 4.5 µm. Polymer layer 1300 can be subsequently patterned to form openings therein where the RDL metal lines will be formed. For example, in FIG. 13, a first RDL 1300 can be formed on die 1000, TIV-walls 610a and 610b and TIV-gratings 620a and 620b. The alignment of first RDL 1300 with die 1000, TIV-walls 610a and 610b, and TIV-gratings 620a and 620b can be achieved with one or more photolithography and etching operations. By way of example and not limitation, a photoresist layer can be spin-coated over polymer layer 1300. The photoresist layer can be patterned so that openings aligned to die 1000, TIV-walls 610a and 610b, and TIV-gratings 620a and 620b can be formed in the photoresist layer. A subsequent etching process can remove the portions of polymer layer 1300 not masked by the photoresist to form openings substantially aligned to die 1000, TIV-walls 610a and 610b, and TIV-gratings 620a and 620b. Once the openings in polymer layer 1300 have been formed, the photoresist layer can be removed and a blanket metal stack can be deposited and patterned to form metal lines 1320 of first RDL 1300.

Figure 13:
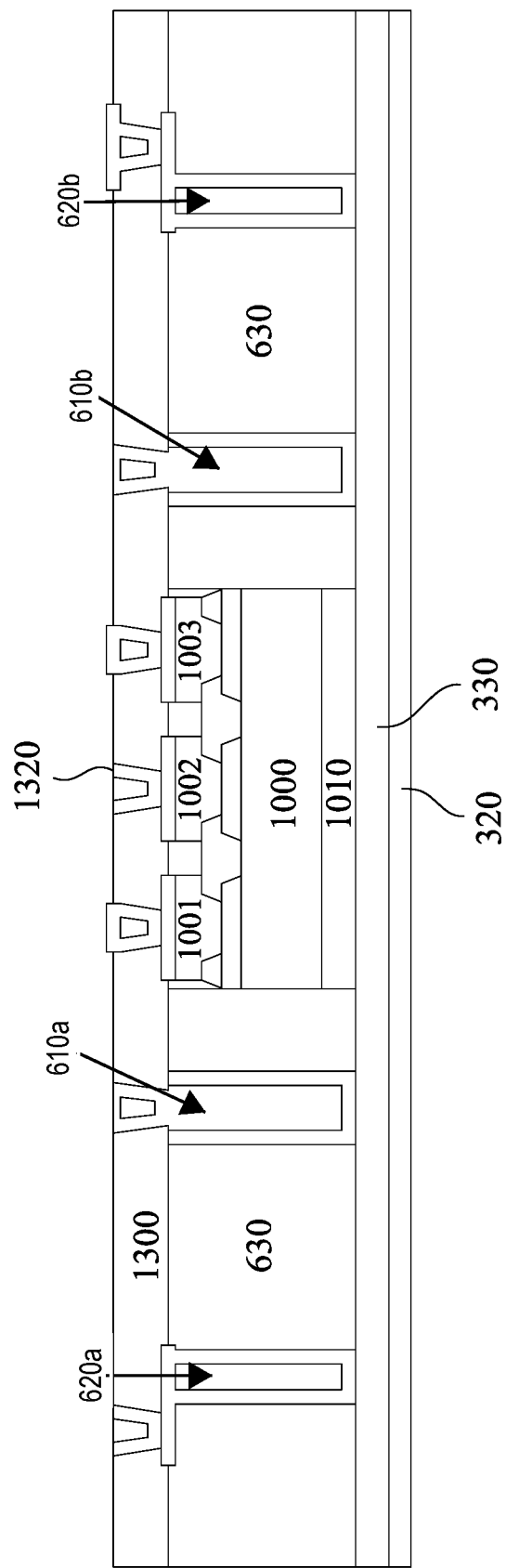

Metal lines 1320 can include a metal stack of electroplated copper top layer, a copper seed middle layer, and a titanium bottom layer. By way of example and not limitation, the titanium bottom layer and the copper seed middle layer can be deposited with a PVD process at a thickness of about 100 nm and 500 nm, respectively. The electroplated copper top layer can have a thickness of about 7 µm or thicker. In some embodiments, the metal stack may partially fill the openings in polymer layer 1300 as shown in FIG. 13.

Figure 14:
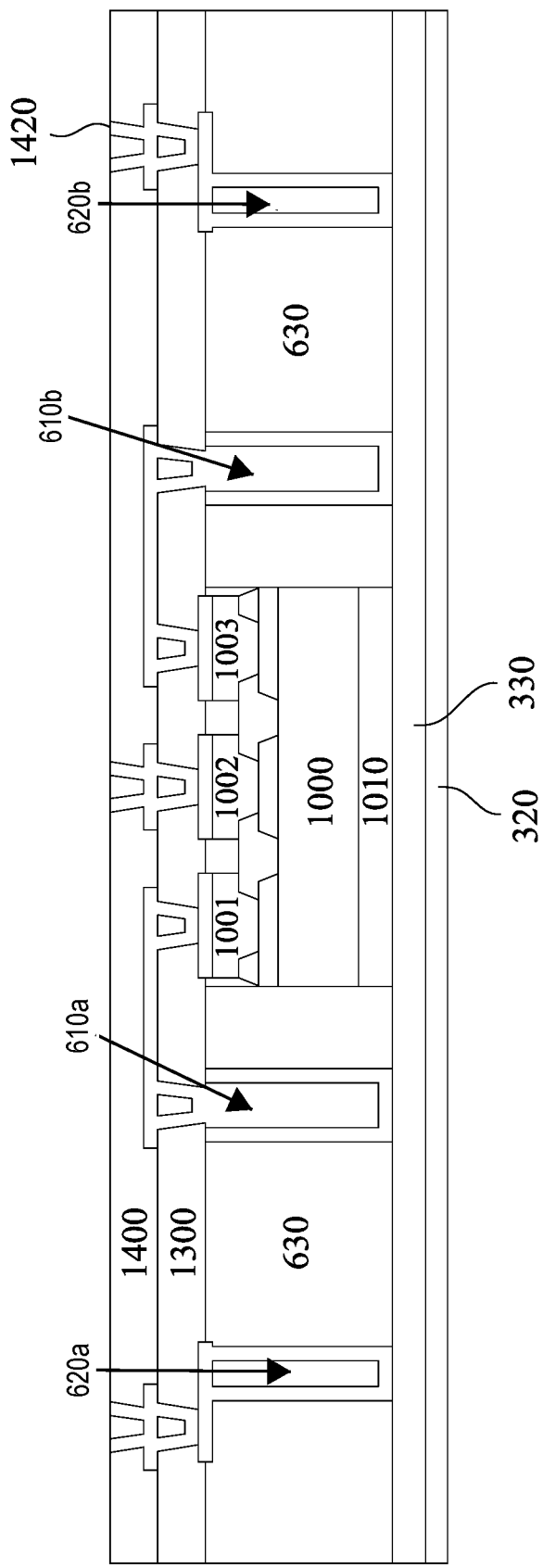

The above operation can be successively repeated to form a second RDL 1400, as shown in FIG. 14. The number of RDL levels provided herein is exemplary and should not be considered limiting. Therefore, fewer or additional RDL levels can be formed depending on the InFO packaging design. By way of example and not limitation, four or more RDLs can be formed over die 1000, TIV-walls 610a and 610b, and TIV-gratings 620a and 620b. In referring to FIG. 15, and once all the RDLs have been formed, a top polymer layer 1500 is disposed over the topmost RDL (e.g., second RDL 1400 in FIG. 14), and subsequently patterned. According to some embodiments, a metal deposition followed by a patterning operation forms under bump metallurgy (UBM) contacts 1510. UBM contacts 1510 form an interface between RDL 1400 and solder bumps 1520, 1530, and 1540. In some embodiments, UBM contacts 1510 can include a metal stack of electroplated copper top layer, a copper seed middle layer, and a titanium bottom layer. Alternatively, UBM contacts 1510 can include an alloy such as titanium (Ti) and copper (Cu), titanium (Ti)-tungsten (W) and copper (Cu), aluminum (Al)-nickel (Ni)-vanadium (V) and copper (Cu), or chromium (Cr) and copper (Cu). Solder bumps 1520, 1530, and 1540 can be part of a ball grid array (BGA) and can be made of a metal alloy that may contain tin (Sn), silver (Ag) and copper (Cu), or a metal alloy that may contain lead (Pb) and tin (Sn).

In some embodiments, carrier substrate 300 can be detached (released) from polymer layer 320. For example, irradiating LTHC 310 with a focused laser beam through the backside of glass carrier substrate 300 can generate sufficient heat to decompose LTHC 310 and release carrier substrate 300 from polymer layer 320. In some embodiments, polymer layer 320 acts as a backside protective layer for the antenna package.

Figure 15:
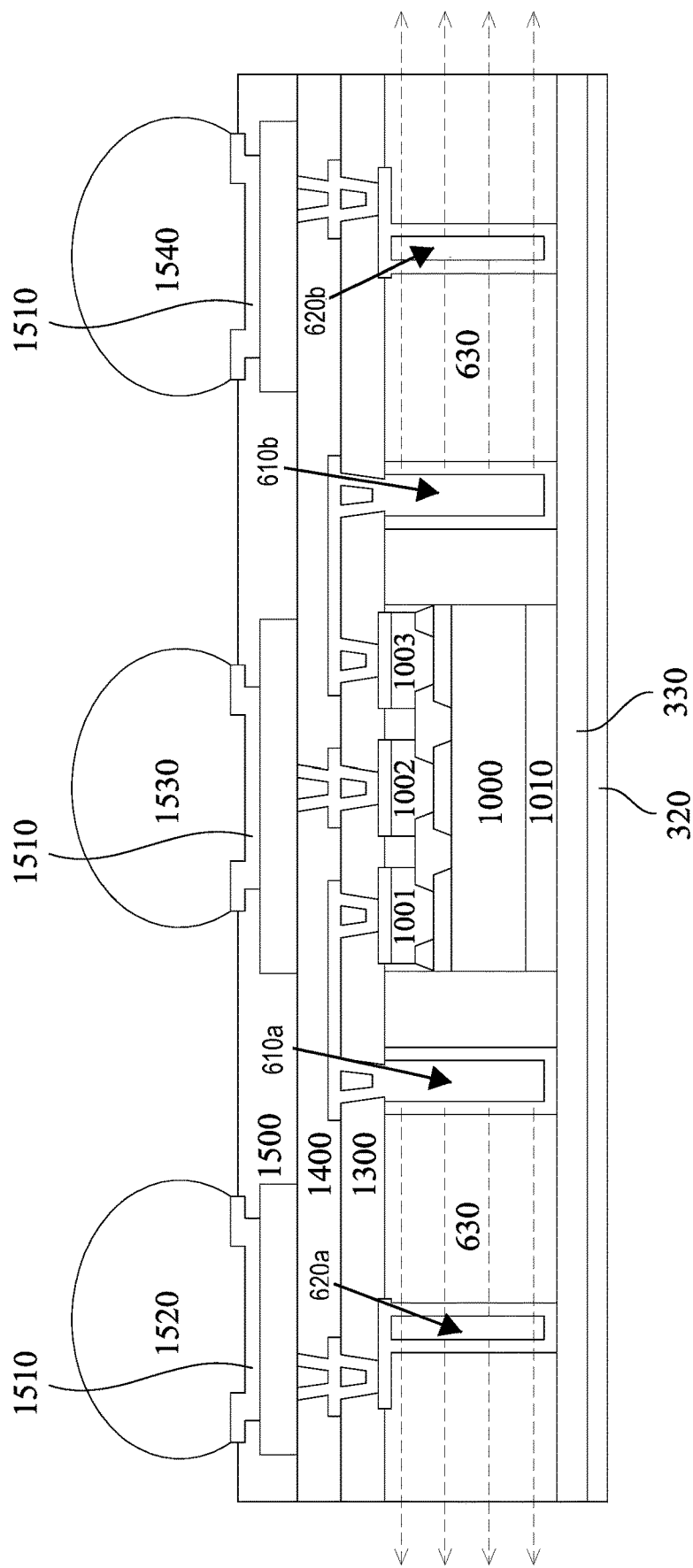

In some embodiments, solder bumps 1520 and 1540 (which are electrically connected to TIV-gratings 620a and 620b) can be connected to an external ground connection. Solder bump 1530 (which is electrically connected to die 1000) can be electrically coupled to an external IC that provides input and power signals to die 1000 through UBM contacts 1510 and metal layer 1320. Further, the number of solder bumps shown in FIG. 15 is not limiting. Therefore, additional solder bumps are within the spirit and the scope of this disclosure.

According to some embodiments, solder bumps, like solder bumps 1520, 1530, and 1540, can electrically connect the InFO packaging to one or more external power supplies or to a ground connection. An external power supply is, for example, a power supply which is not integrated into the InFO packaging. For example, the InFO packaging with die 1000 can be attached through solder bumps 1520, 1530, and 1540 to a die or a printed circuit board (PCB) with solder bumps receptors. Die 1000 can be used by internal or external components of InFO packaging.

Figure 16:
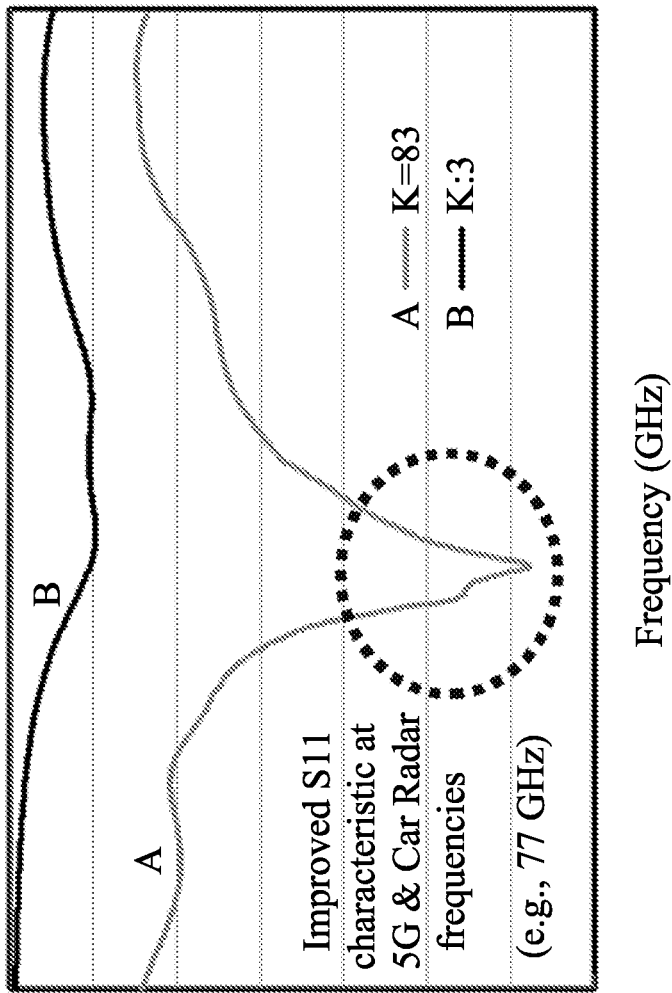
FIG. 16 is an illustration of performance characteristics of an insulating substrate antenna, according to some embodiments.

As noted above, the antenna region structure according to some embodiments of the present disclosure may improve the reflection coefficient (the S11 parameter) of the integrated patch antenna in the InFO package, especially in high frequency applications that employ antenna efficiency at frequencies of 5.8 GHz and higher. FIG. 16 is a plot of the S11 parameter, the reflection coefficient, of the insulating substrate antenna 1500 structure having the insulator filled antenna region 630 shown in FIG. 15. The S11 values were generated from a simulation of one embodiment of an insulating substrate antenna 1500 structure shown in FIG. 15. As shown in the plot, the antenna efficiently radiates frequencies at and above 5.8 GHz, including frequencies at and above 120 GHz. An antenna package having antenna regions according to embodiments of the present disclosure have RF characteristics suitable for meeting the specifications of fourth generation (e.g., approximately 5.8 GHz) and fifth generation (e.g., approximately 38 GHz) high frequency RF transceivers in mobile communication applications. As described herein, an antenna package, systems and methods for forming the same, as described herein includes a die and antenna region structures. The antenna region structures can include one or more through-insulator via (TIV)-wall structures and one or more TIV-grating structures on a backside layer. The die and the antenna region structures are encapsulated with a molding compound. The antenna package attains a benefit in propagating signal transmission, including high-frequency lateral RF transmission, with improved grounding and return loss.

A method includes depositing a dielectric layer on a carrier substrate, forming a die-attach film over the dielectric layer, forming one or more through-interposer via wall structures and one or more TIV-grating structures on the dielectric layer, disposing a die on the DAF, encapsulating the die, the one or more TIV-wall structures, and the one or more TIV-grating structures to form an encapsulated package comprising one or more antenna regions, and forming an interconnect structure on the encapsulated package, wherein the interconnect structure comprises one or more metal lines coupled to the die and the one or more TIV-wall structures.

An antenna package includes a dielectric layer, antenna region structures, wherein each of the antenna region structures comprises: one or more through interposer via walls in contact with the dielectric layer, one or more TIV-gratings in contact with the dielectric layer, a die attached to the dielectric layer and adjacent to the antenna region structures, a molding compound disposed between the die and each of the antenna region structures, and an interconnect layer disposed on the die and the antenna region structures.

A system includes a backside layer, one or more dies, antenna region structures, wherein each antenna region structure includes: a through interposer via wall configured to electrically couple to the one or more dies, and a TIV-grating configured to electrically couple to one or more ground planes, a molding compound surrounding the one or more dies and the antenna region structures, and a metal layer on the molding compound.

CONCLUSION

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a through interposer via wall (TIV-wall) structure on a dielectric layer;
   forming a TIV-grating structure on the dielectric layer, wherein a bottom surface of the TIV-grating structure is in contact with a top surface of the dielectric layer;
   forming an interconnect structure on the TIV-wall structure and the TIV-grating structure; and
   enclosing a space by the TIV-wall structure, the TIV-grating structure, the interconnect structure, and the dielectric layer to form an antenna region.

2. The method of claim 1, further comprising:
   forming a die-attach film (DAF) over the dielectric layer; and
   attaching a die to the DAF.

3. The method of claim 1, wherein enclosing the space comprises encapsulating the TIV-wall structure and the TIV-grating structure with a molding compound to form an encapsulated package comprising the antenna region.

4. The method of claim 1, further comprising:
   forming a first redistribution layer (RDL) on the interconnect structure;
   forming a second RDL on the first RDL;
   attaching solder bumps to the second RDL; and
   attaching a printed circuit board (PCB) to the solder bumps.

5. The method of claim 1, wherein forming the TIV-wall structure and the TIV-grating structure on the dielectric layer comprises:
   forming a photoresist layer on the dielectric layer;
   etching the photoresist layer to form a TIV-wall opening and a TIV-grating opening;
   depositing a titanium and copper seed layer stack in the TIV-wall and TIV-grating openings;
   electroplating a copper layer on the titanium and copper seed layer stack; and
   removing the photoresist layer.

6. The method of claim 1, further comprising:
   forming a light to heat conversion (LTHC) layer on a glass carrier substrate;
   forming a protective layer between the LTHC layer and the dielectric layer; and
   decomposing the LTHC layer by irradiation to separate the glass carrier substrate from the protective layer.

7. A structure, comprising:
   a through interposer via wall (TIV-wall) on a dielectric layer;
   a TIV-grating on the dielectric layer, wherein a bottom surface of the TIV-grating is in contact with a top surface of the dielectric layer;
   an interconnect layer on the TIV-wall and the TIV-grating; and
   an antenna region comprising a space enclosed by the TIV-wall, the TIV-grating, the interconnect layer, and the dielectric layer.

8. The structure of claim 7, further comprising an additional TIV-grating, wherein an alignment direction of the TIV-grating and the additional TIV-grating is substantially parallel to the TIV-wall.

9. The structure of claim 7, further comprising:
   a die attached to the dielectric layer by a die-attach film (DAF); and
   a molding compound disposed between the die and the antenna region.

10. The structure of claim 9, wherein the molding compound has a dielectric constant between about 2.8 and about 3.0.

11. The structure of claim 7, further comprising:
    a redistribution layer (RDL) disposed on the interconnect layer; and
    solder bumps disposed on the RDL.

12. The structure of claim 7, wherein the TIV-wall has a height between about 120 µm and about 150 µm.

13. The structure of claim 7, wherein the antenna region has a height between about 200 µm and about 2 mm.

14. The structure of claim 7, further comprising a protective layer, wherein the protective layer and the dielectric layer comprise a polyimide (PI), a polybenzoxazole (PBO), a benzocyclobutene (BCB), an ajinomoto buildup film (ABF), a solder resist film (SR), or combinations thereof.

15. The structure of claim 7, further comprising an additional antenna region comprising an additional space enclosed by an additional TIV-wall, an additional TIV-grating, the interconnect layer, and the dielectric layer.

16. A system, comprising:
    a through interposer via wall (TIV-wall) on a dielectric layer and electrically coupled to an electric potential;
    a TIV-grating on the dielectric layer and electrically coupled to ground, wherein a bottom surface of the TIV-grating is in contact with a top surface of the dielectric layer;
    an interconnect layer on the TIV-wall and the TIV-grating; and
    an antenna region enclosed by the TIV-wall, the TIV-grating, the interconnect layer, and the dielectric layer.

17. The system of claim 16, further comprising a radio frequency (RF) die attached to the dielectric layer by a die-attach film (DAF) and electrically coupled to the electric potential.

18. The system of claim 16, wherein the antenna region comprises a molding compound with a dielectric constant between about 2.8 and about 3.0.

19. The system of claim 16, further comprising an additional antenna region enclosed by an additional TIV-wall, an additional TIV-grating, the interconnect layer, and the dielectric layer.

20. The system of claim 16, further comprising an additional TIV-grating, wherein an alignment direction of the TIV-grating and the additional TIV-grating is substantially parallel to the TIV-wall.

* * * * *